United States Patent [19]

Notomi

[11] Patent Number: 5,841,704
[45] Date of Patent: Nov. 24, 1998

[54] STATIC RAM

[75] Inventor: Seishi Notomi, Kawasaki, Japan

[73] Assignee: Fujitsu Limited, Kawasaki, Japan

[21] Appl. No.: 838,782

[22] Filed: Apr. 10, 1997

Related U.S. Application Data

[63] Continuation of Ser. No. 534,814, Sep. 27, 1995, abandoned, which is a continuation of Ser. No. 10,305, Jan. 28, 1993, abandoned.

[30] Foreign Application Priority Data

Jan. 30, 1992 [JP] Japan ........................................ 4-15514

[51] Int. Cl.⁶ .................................................. G11C 7/00
[52] U.S. Cl. ............................... 365/189.09; 365/189.07; 365/189.11
[58] Field of Search ......................... 365/189.11, 189.09, 365/189.07

[56] References Cited

U.S. PATENT DOCUMENTS 4,799,193  1/1989  Horiguchi et al. ............... 365/189.09 X
4,875,195  10/1989  Momodomi et al. .............. 365/230.08
5,050,127  9/1991  Mitsumoto et al. ................ 365/189.09
5,253,201  10/1993  Atsumi et al. .................. 365/189.09 X
5,307,315  4/1994  Oowaki et al. ..................... 365/189.09

FOREIGN PATENT DOCUMENTS

A-0090591  10/1983  European Pat. Off. .

OTHER PUBLICATIONS

IEEE International Solid State Circuits Conference, vol. 34, Feb. 1991, Suzuki et al.

*Primary Examiner*—Do Hyun Yoo
*Attorney, Agent, or Firm*—Armstrong, Westerman, Hattori, McLeland & Naughton

[57] ABSTRACT

An SRAM using Schottky gate FETs and immune to variations in the process parameters or a change in temperature, and which does not permit the voltage amplitude of the bit lines to be changed by variations in the process parameters or by a change in temperature. This is accomplished by providing a bit line pull-up circuit 100 which is so constituted that a voltage difference between the reference voltages Vref1 and Vref2 that do not change depending upon the temperature is reflected on the voltage amplitude of the bit lines BL, $\overline{BL}$ during the reading operation.

4 Claims, 7 Drawing Sheets

STATIC RAM

This application is a continuation of application Ser. No. 08/534,814 filed Sep. 27, 1995, now abandoned; which is a continuation of application Ser. No. 08/010,305 filed Jan. 28, 1993, now abandoned.

BACKGROUND OF THE INVENTION

1. Field of the Invention

The present invention relates to a static random access memory, hereinafter referred to as static RAM, which is formed by using Schottky gate FETs such as MES FETs (metal semiconductor FETs) or HEMTs (high electron mobility transistors).

2. Description of the Related Art

In recent years, there has been a demand to provide static RAMs that operate at high speeds. To meet this demand, it is necessary to decrease the voltage amplitude on bit lines and data lines during a reading operation in order to reduce the delay times through the bit lines and data lines. Therefore, it becomes necessary to provide a bit line pull-up circuit for stably controlling the voltage amplitude of the bit lines and to provide a data line pull-up circuit for stably controlling the voltage amplitude of the data lines.

FIG. 5 shows a major portion of a conventional SRAM of this kind, wherein reference numeral 1 denotes a memory cell, WL denotes a word line, BL and $\overline{BL}$ denote bit lines, and reference numeral 2 denotes a bitline pull-up circuit.

In the memory cell 1, furthermore, reference numeral 3 denotes a flip-flop, 4 and 5 denote VCC power-source lines that feed a power-source voltage VCC of, for example, 2 volts, and reference numerals 6 and 7 denote VSS power-source lines that feed a power-source voltage VSS of, for example, 0 volt.

Moreover, reference numerals 8 and 9 denote depletion-type Schottky gate FETs (hereinafter referred to as D·FESs), and 10 and 11 denote enhancement-type Schottky gate FETs (hereinafter referred to as E·FETs).

Reference numerals 12 and 13 denote E·FETs that constitute transfer gates.

In the bit line pull-up circuit 2, furthermore, reference numerals 14 and 15 denote VCC power-source lines, and 16 and 17 denote D·FETs which have their gates connected to their sources.

FIG. 6 is a diagram which illustrates the voltage amplitude when a bit line BL in the SRAM is being read out, and wherein the abscissa represents the voltage $V_{BL}$ of the bit line BL. In FIG. 6, a curve $I_{MC}$ represents a current that flows into the E·FET 12 when the word line WL assumes the H level and the E·FET 12 is turned on, and a curve $I_{BP1}$ represents a current that flows into the D·FET 16.

That is, in this SRAM, the H level value of the voltage amplitude when the bit line BL is being read out is the power-source voltage VCC, and the L level value is the voltage of the bit line BL when $I_{MC} = I_{BP1}$.

In the SRAM, as described above, the H level value of the voltage amplitude when the bit line BL is being read out becomes equal to the power-source voltage VCC. Therefore, there arises a problem in that the voltage amplitude changes when the bit line BL is being read out accompanying a change in the power-source voltage VCC.

Therefore, there has been proposed another SRAM, a major portion of which is shown in FIG. 7. This SRAM is equipped with a bit line pull-up circuit 22 which is formed in the same manner as the bit line pull-up circuit 2 that is shown in FIG. 5, but in which diodes 20 and 21 are connected in the forward direction between the bit lines BL, $\overline{BL}$ and the VSS power-source lines 18, 19.

FIG. 8 is a diagram illustrating the voltage amplitude when bit lines BL in the SRAM are being read out, and wherein the abscissa represents the voltage $V_{BL}$ of the bit line BL similar to FIG. 6. A curve $I_{MC}$ represents a current that flows into the E·FET 12 when the word line WL assumes the H level and the E·FET 12 is turned on, a curve $I_{BP2}$ represents a current that flows into the D·FET 16, and a curve $I_D$ represents a current that flows into a diode 20. Here, $I_{BP2} = I_{BP1} - I_D$.

That is, in this SRAM, the H level value of the voltage amplitude of when the bit line BL is being read out is $V_1$ if the voltage of the bit line BL at the time when $I_{BP2} = 0$ is $V_1$, and the L level value becomes the voltage of the bit line BL when $I_{MC} = I_{BP2}$.

According to this SRAM, therefore, the voltage amplitude is not affected at the time when the bit lines BL, $\overline{BL}$ are read out unless the power-source voltage VCC drops down to become smaller than the voltage $V_1$. Thus, the voltage amplitude is stabilized correspondingly.

In the conventional SRAM shown in FIG. 7, however, the voltage amplitude when the bit lines BL, $\overline{BL}$ are read out is determined depending upon the characteristics of the E·FETs 12, 13, D·FETs 16, 17, and diodes 20, 21, and are susceptible to variations in the process parameters and a change in the temperature. Therefore, the voltage amplitude undergoes a change depending on the variations in the process parameters and a change in the temperature, and loses stability in this regard. Though not diagrammed, similar problems arise even in the data line pull-up circuit that is provided commonly for a plurality of bit lines.

SUMMARY OF THE INVENTION

In view of the above-mentioned points, the object of the present invention is to provide a static RAM which is immune to variations in the process parameters or a change in temperature and which does not permit the voltage amplitude of the bit lines or the data lines to be changed by variations in the process parameters or by a change in temperature, as well as to provide a static RAM which is immune to variations in the process parameters or a change in temperature and which does not permit the voltage amplitude of the data lines to be changed by variations in the process parameters or a change in temperature.

Another object of the present invention is to provide a static RAM which minimizes the logic voltage amplitude of a signal read line during the reading operation and stabilizes the voltage amplitude, enabling the reading operation to be carried out stably and at a high speed.

In order to accomplish the above-mentioned objects, the present invention basically employs the technical circuit construction described below. That is, the invention is concerned with a static RAM equipped with a signal read line pull-up circuit which comprises a reference voltage-forming circuit which is connected to a first power-source line that feeds a first power-source voltage and is connected to a second power-source line that feeds a second power-source voltage smaller than the first power-source voltage, and forms at least either one of a first reference voltage or a second reference voltage that does not change depending upon temperature, the first reference voltage and the second reference voltage being different from each other; and a means which determines the logic voltage amplitude of a signal read line during the reading operation based upon either a potential difference between the first reference voltage and the second reference voltage formed by the reference voltage-forming circuit or a potential difference between one of the power-source voltages and the reference voltage produced by the reference voltage30 forming circuit.

The SRAM according to a first embodiment of the present invention is provided with a bit line pull-up circuit which has a voltage difference between the first reference voltage that does not change depending upon temperature and the second reference voltage that does not change depending upon temperature and is lower than the first reference voltage, which are produced by the reference voltage-forming circuit, is reflected in the voltage amplitude of the bit lines during the reading operation.

According to a second embodiment of the present invention, furthermore, the SRAM is provided with a data line pull-up circuit which is provided in common for a plurality of bit lines and in which a voltage difference between the first reference voltage that does not change depending upon temperature and the second reference voltage that does not change depending upon temperature and is higher than the first reference voltage, or a voltage difference between the first reference voltage produced by the reference voltage-forming circuit that forms the first reference voltage only and the second reference voltage, or a voltage difference between the first reference voltage and the power source voltage, is reflected in the voltage amplitude of the data lines during the reading operation.

In the first embodiment in which a voltage difference between the first reference voltage that does not change depending upon temperature and the second reference voltage that does not change depending on temperature and is reflected on the voltage amplitude of the bit lines during the reading operation, the voltage amplitude of the bit lines remains constant during the reading operation irrespective of variations in the process parameters or a change in temperature.

In the second embodiment in which a voltage difference between the first reference voltage and the second reference voltage both of which do not change depending upon temperature, or a voltage difference between the first reference voltage that does not change depending upon temperature and the power-source voltage, is reflected on the voltage amplitude of the data lines during the reading operation, the voltage amplitude of the data lines remains constant during the reading operation irrespective of variations in the process parameters or a change in temperature.

DESCRIPTION OF THE PREFERRED EMBODIMENT

Figure 1:
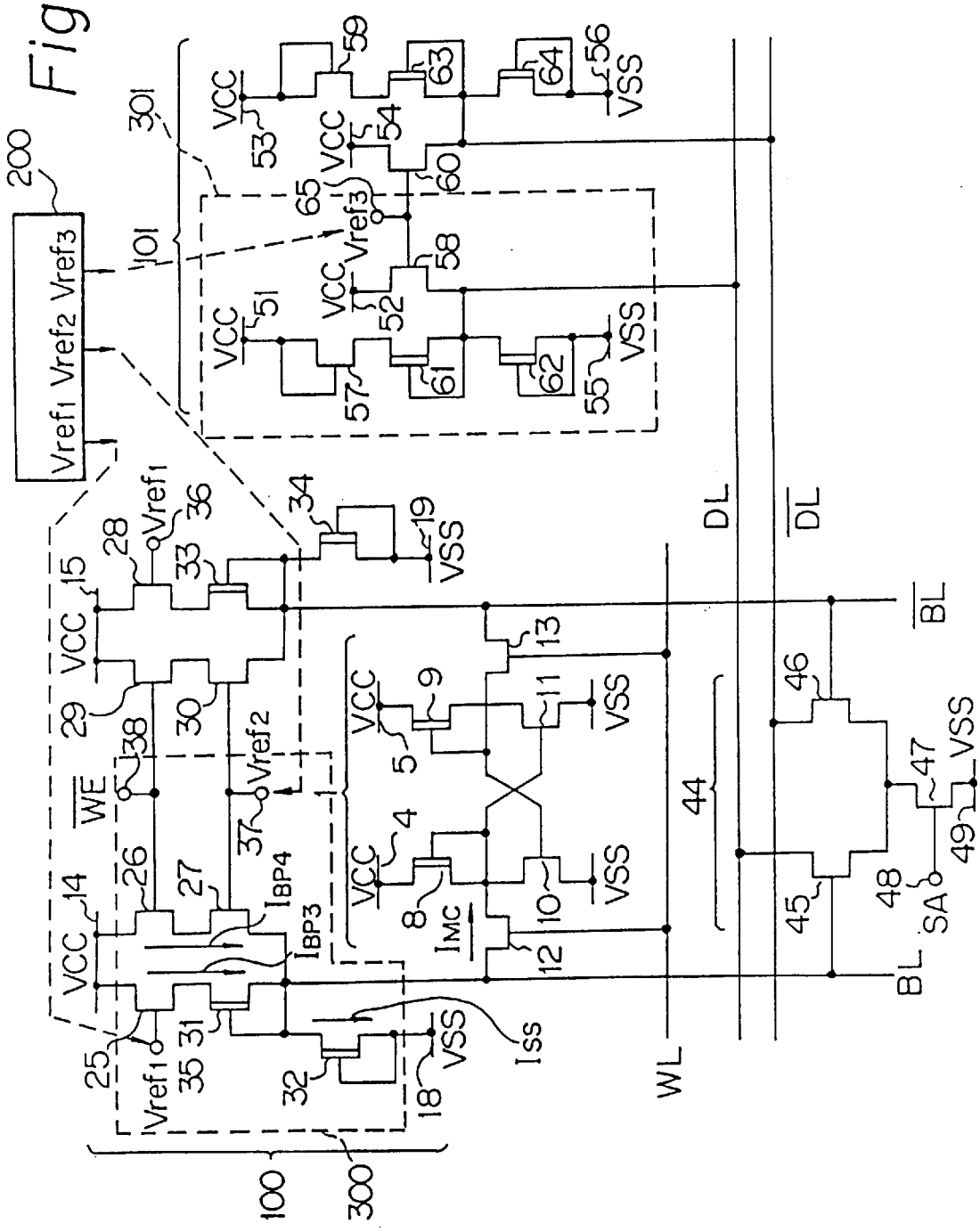
FIG. 1 is a circuit diagram illustrating a major portion of an embodiment of the present invention.
Figure 7:
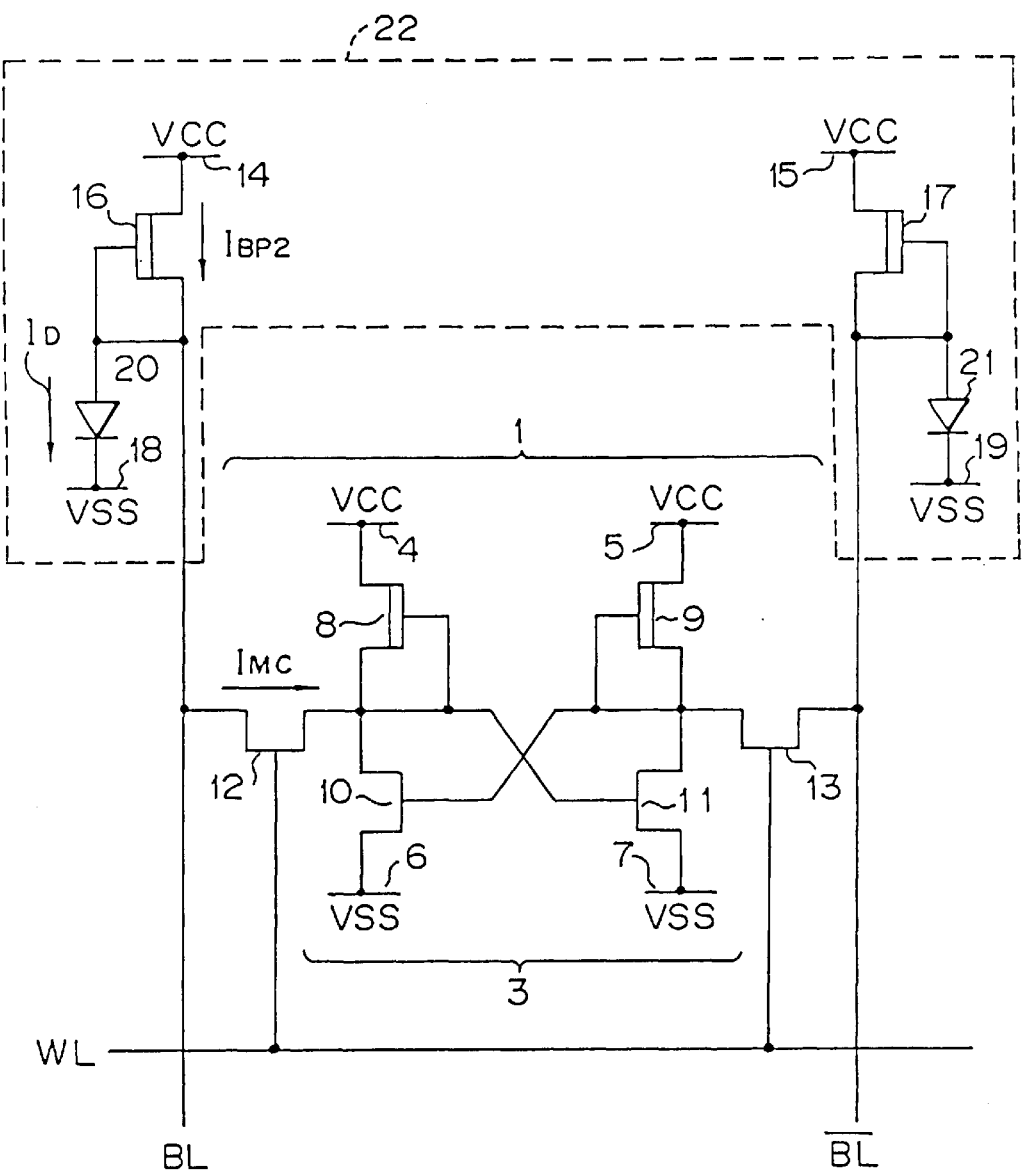
FIG. 7 is a circuit diagram illustrating a major portion of another conventional static RAM.

An embodiment of the present invention will now be descried in conjunction with FIGS. 1 to 4. In FIG. 1, the portions corresponding to those of FIGS. 5 and 7 are denoted by the same reference numerals but are not described here again.

FIG. 1 illustrates a signal read line pull-up circuit employed in a static RAM according to the present invention. That is, FIG. 1 shows a static RAM equipped with a signal read line pull-up circuit 100 which comprises a reference voltage-forming circuit 200 which is connected to a first power-source line 14 that feeds a first power-source voltage, e.g., VCC, and is connected to a second power-source line 18 that feeds a second power-source voltage, e.g., VSS smaller than the first power-source voltage VCC, and forms at least either one of a first reference voltage Vref1 that does not change depending upon the temperature or a second reference voltage Vref2 that is different from the first reference voltage Vref1; and a means 300 which determines the logic voltage amplitude of a read signal line during the reading operation based upon either a potential difference between the first reference voltage Vref1 and the second reference voltage Vref2 formed by said reference voltage-forming circuit 200 or a potential difference between one of said power-source voltage VCC or VSS and the reference voltage Vref1 or Vref2 produced by the reference voltage-forming circuit.

That is, according to the present invention, preset reference voltages are used, and the logic voltage amplitude of the signal read line is stably set to a predetermined width during the reading operation relying upon a potential difference between the above reference voltages or upon a potential difference between a first power-source voltage VCC and the reference voltage, in order to preclude changes in the characteristics of the transistors and other electronic parts caused through manufacturing steps and to cancel changes in the characteristics caused by a change in temperature. The signal read lines according to the present invention may be bit lines BL, $\overline{BL}$ or data lines DL, $\overline{DL}$.

The reference voltage-forming circuit 200 used in the present invention can, for example, be a so-called resistance division-type voltage generating circuit in which suitable resistors are arranged in series and the output is taken out from a point among them.

Next, described below is the read line pull-up circuit 100 having a logic voltage amplitude determining means 300 of FIG. 1 according to a first embodiment of the present invention.

That is, the signal read line pull-up circuit 100 of the present invention includes a first field-effect transistor 25 which is connected at its drain to a first power-source 14 that feeds the first power-source voltage VCC and is supplied through its gate with the first reference voltage Vref1, a first constant-current source circuit 31 which is connected at its one end to the source of the first field-effect transistor 25 and is connected at its other end to a bit line BL that is the signal read line, a second constant-current source circuit 32 which is connected at its one end to the bit line BL that is the signal read line and is connected at its other end to a second power-source line 18 that feeds a second power-source voltage VSS lower than the above first power-source voltage VCC, a second field-effect transistor 26 which is connected at its drain to the first power-source line 14 and is supplied with a write enable signal $\overline{WE}$ through its gate, and a third field-effect transistor 27 which is connected at its drain to the source of the second field-effect transistor 26, supplied with the second reference voltage Vref2 through its gate, and is connected at its source to the bit line BL that is the signal read line.

In the present invention, either the first reference voltage Vref1 or the second reference voltage Vref2 may be the first power-source voltage VCC. Moreover, the signal read line may be the bit line BL or the data line DL.

It is desirable that the first to third field-effect transistors (FETS) used in the present invention are enhancement-type FETs. In the present invention, furthermore, it is desired that enhancement-type FETs are the Schottky gate field-effect transistors.

On the other hand, it is desired that the constant-current source circuits 32, 31 are formed with depletion-type field-effect transistors.

Described below are the construction and operation of the above-mentioned signal read line pull-up circuit 100 of the present invention.

In FIG. 1, reference numeral 300 denotes a logic voltage amplitude determining means of the bit line pull-up circuit 100, reference numerals 25 to 30 denote E·s, and 31 to 34 denote D·FETs.

Furthermore, reference numerals 35 and 36 denote reference voltage input terminals to which the reference voltage Vref1 will be input, reference numeral 37 denotes a reference voltage input terminal to which will be input the reference voltage Vref2 that is lower than the reference voltage Vref1, and reference numeral 38 denotes a write enable signal input terminal to which a write enable signal $\overline{WE}$ will be input.

Figure 2:
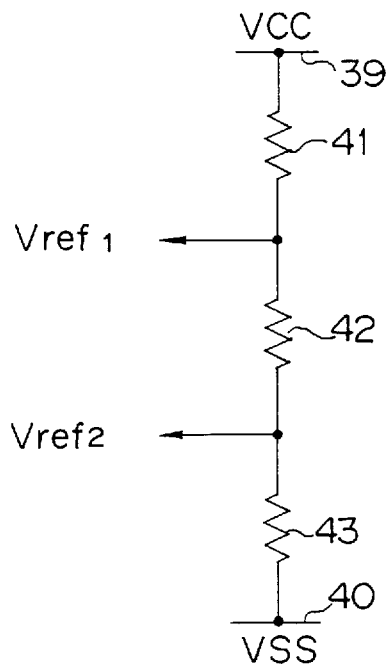
FIG. 2 is a circuit diagram illustrating a reference voltage-forming circuit.

The reference voltages Vref1 and Vref2 are formed by a voltage divider circuit that is shown in FIG. 2, wherein reference numeral 39 denotes a VCC power-source line, 40 denotes a VSS power-source line, and reference numerals 41, 42 and 43 denote resistors.

Here, if the resistors 41, 42 and 43 have resistances R41, R42 and R43, then, the reference voltage Vref1 is given as Vref1=(VCC−VSS)×[(R42+R43)/(R41+R42+R43)] and the reference voltage Vref2 is given as Vref2=(Vcc−VSS)× [R43/(R41+R42+R43)].

Here, since the voltage-dividing ratios (R42+R43)/(R41+ R42+R43) and R43/(R41+R42+R43) remain constant irrespective of a change in the temperature, the reference voltages Vref1 and Vref2 remain constant, too, irrespective of the change in temperature.

In FIG. 1, furthermore, reference numeral 44 denotes a pre-sense amplifier, 45 to 47 denote E·FETS, 48 denotes a pre-sense amplifier activating signal input terminal to which will be input a pre-sense amplifier activating signal SA, reference numeral 49 denotes a VSS power-source line, and DL and $\overline{DL}$ denote data buses.

In the above-mentioned embodiment, the D·FETs 31 and 32 operate as a constant-current source circuit as described above. Therefore, any D·FETs can be used provided they have a function of flowing constant currents, and the D·FETs 31 and 32 are merely an example thereof. In this case, the above D·FETs will be called fourth and fifth FETS.

Figure 4:
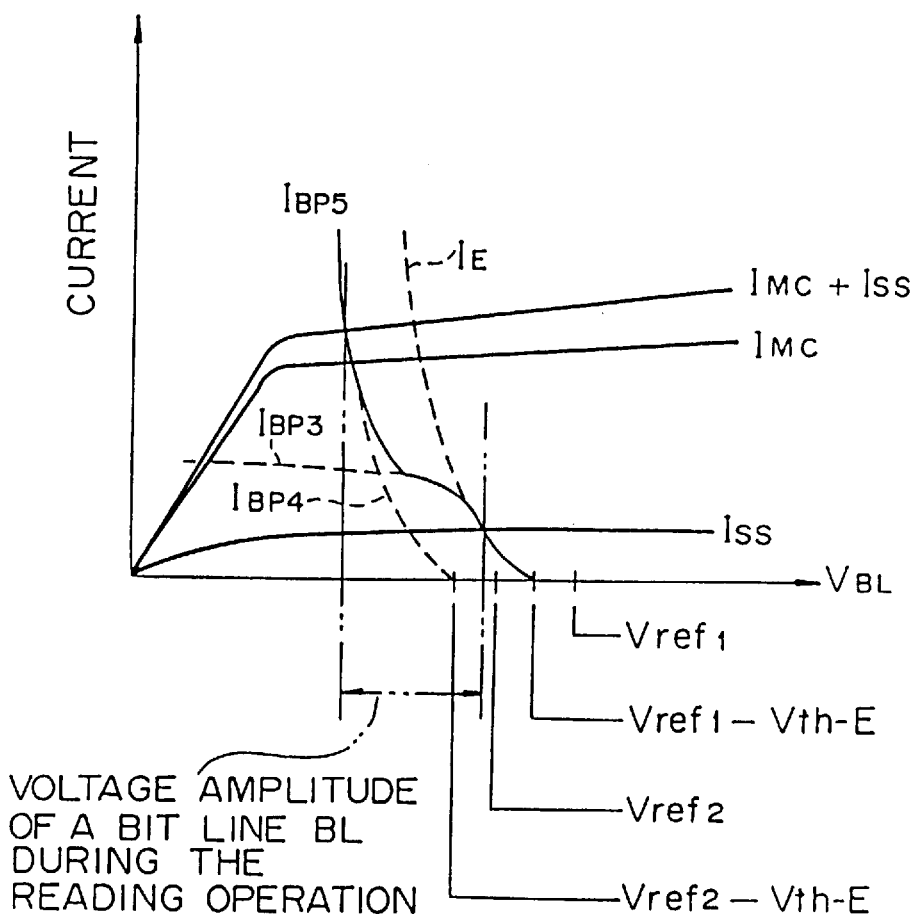
FIG. 4 is a diagram for explaining the operation of the embodiment of the present invention.
Figure 5:
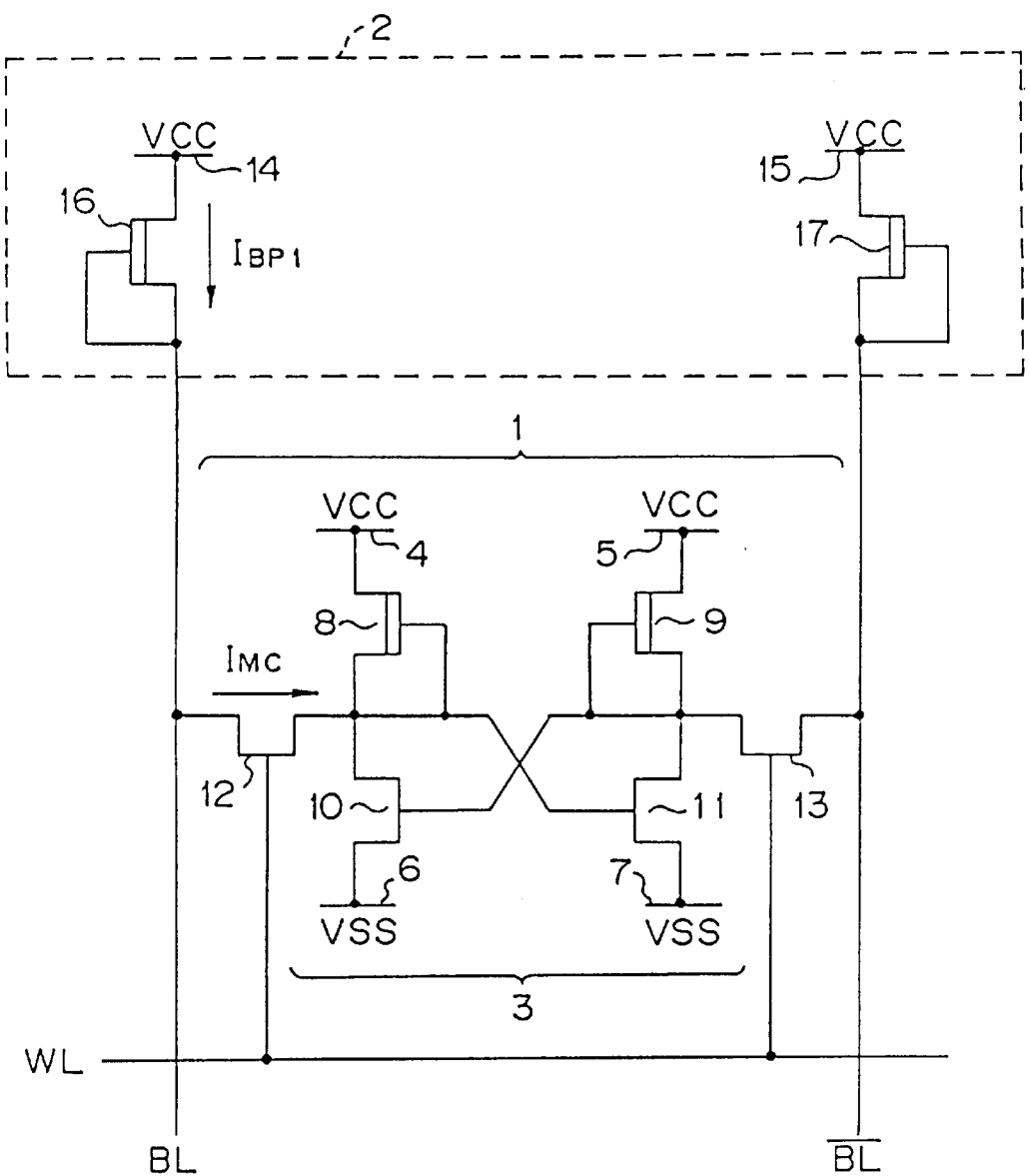
FIG. 5 is a circuit diagram illustrating a major portion of a conventional static RAM.
Figure 6:
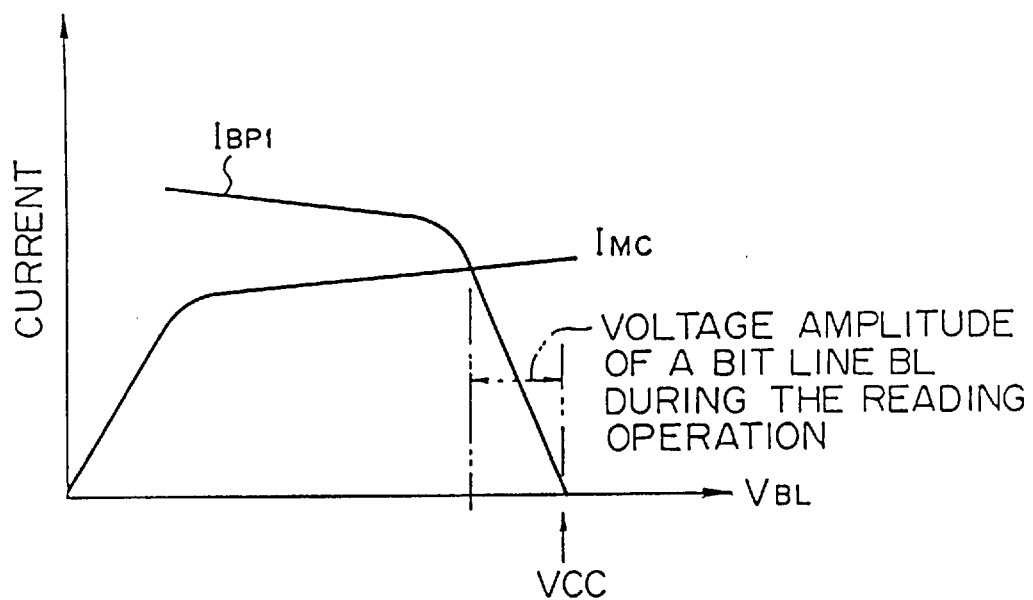
FIG. 6 is a diagram for explaining the operation of the static RAM shown in FIG. 5.
Figure 8:
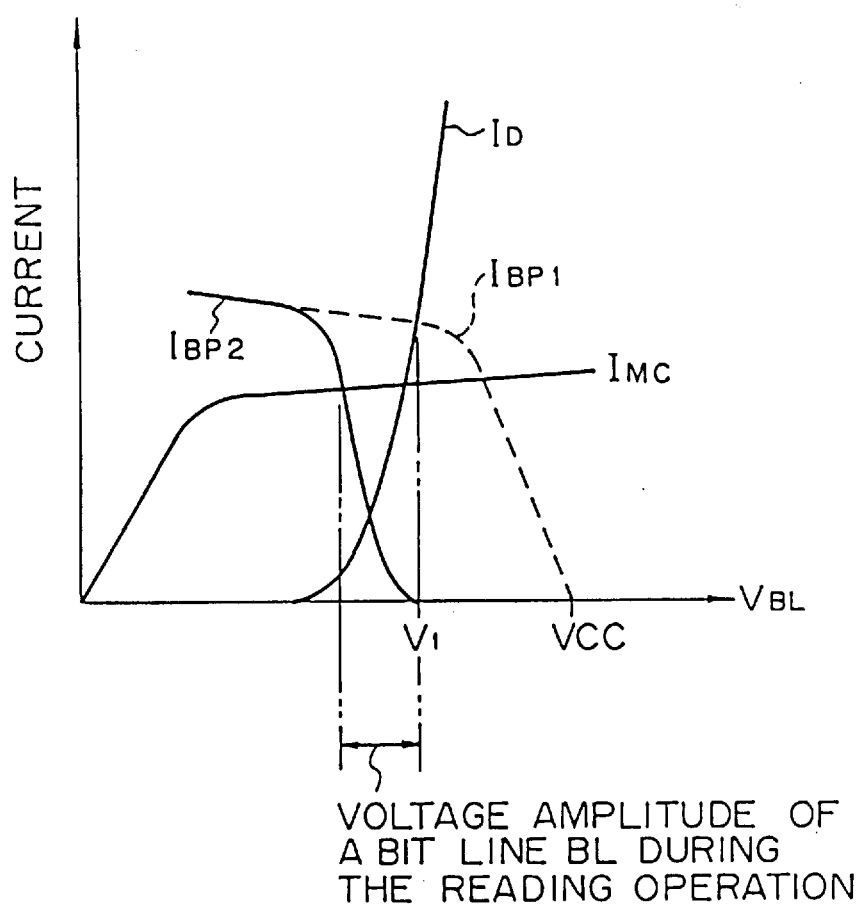
FIG. 8 is a diagram for explaining the operation of the static RAM shown in FIG. 7.

FIG. 4 is a diagram showing the voltage amplitude of a bit line BL during the reading operation, i.e., in the case when the write enable signal $\overline{WE}$ assumes the H level and the E·FET 26 is turned on, and wherein the abscissa represents the voltage $V_{BL}$ of the bit line BL like in FIGS. 6 and 8.

Like in FIGS. 6 and 8, a curve $I_{MC}$ represents the current that flows into the E·FET 12 when the word line WL assumes the H level and the E·FET 12 is turned on, a curve $I_{SS}$ represents the current that flows into the D·FET 32, a curve $I_{BP3}$ represents the current that flows into the E·FET 25 and the D·FET 31, a curve IBP4 represents the current that flows into the E·FETs 26 and 27, a curve $I_E$ represents the current that flows into the E·FETs 25 when D·FET 31 does not exist, and a curve $I_{BP5}$ represents the current $I_{BP3}+I_{BP4}$.

That is, according to this embodiment, the value of the H level of the voltage amplitude when the bit line BL is being read is the voltage of the bit line BL when $I_{BP5}=I_{SS}$, and the value of L level is the voltage of the bit line BL when $I_{BP5}=I_{MC}+I_{SS}$.

Here, the current $I_{BP5}$ is nearly in agreement with the current $I_E$ in a so-called small-current region which includes a portion where $I_{BP5}=I_{SS}$, and is nearly in agreement with the current $I_{BP4}$ in a so-called large-current region which includes a portion where $I_{BP5}=I_{MC}+I_{SS}$.

Furthermore, the current $I_E$ starts flowing when the voltage VBL of the bit line BL becomes greater than Vref1-Vth-E (threshold voltage of the E·FET), and the current $I_{BP4}$ starts flowing when the voltage $V_{BL}$ of the bit line BL becomes greater than Vref2-Vth-E.

In FIG. 4, a curve representing the current $I_E$ is nearly in parallel with a curve representing the current $I_{BP4}$. That is, the voltage difference of the bit line BL of when $I_E=I_{BP4}$ is (Vref1-Vth-E)−(Vref2-Vth-E) =Vref1−Vref2.

According to this embodiment as described above, the reference voltages Vref1 and Vref2 do not change depending upon temperature, and the current $I_E$ and the current $I_{BP4}$ maintain a parallel relationship in FIG. 4. Therefore, the voltage difference between the reference voltages Vref1 and Vref2 is reflected on the voltage amplitude of the bit line BL during the reading operation, i.e., the voltage amplitude is exclusively determined.

That is, according to the present invention, the voltage amplitude of the bit lines BL, $\overline{BL}$ is maintained constant during the reading operation irrespective of variations in the process parameter or a change in the temperature, and a stable voltage amplitude is maintained.

As designated at 300 in FIG. 1, the concrete constitution according to the first embodiment of the present invention includes a first enhancement-type Schottky gate field-effect transistor 25 which is connected at its drain to a first power-source line 14 that feeds the fist power-source voltage VCC and is supplied through its gate with the first reference voltage Vref1, a fourth depletion-type Schottky gate field-effect transistor 31 which is connected at its drain to the source of the first Schottky gate field-effect transistor 25 and is connected at its gate and source to the bit line BL, a fifth depletion-type Schottky gate field-effect transistor 32 which is connected at its drain to the bit line BL and is connected at its gate and source to the second power-source line 18 that feeds the second power-source voltage VSS smaller than the first power-source line 14, a second enhancement-type Schottky gate field-effect transistor 26 which is connected at its drain to the first power-source line 14 and is supplied through its gate with a write enable signal $\overline{WE}$, and a third enhancement-type Schottky gate field-effect transistor 27 which is connected at its drain to the source of the second Schottky gate field-effect transistor 26, supplied through its gate with the second reference voltage Vref2, and is connected at its source to the bit line BL.

Next, described below is a second embodiment of the present invention in which a logic voltage amplitude determining means 301 during the reading of the present invention is employed for a data line pull-up circuit 101.

As shown in FIG. 1 the pull-up circuit 101 for the data lines DL, $\overline{DL}$ includes a sixth field-effect transistor 57 which is connected at its drain to a first power-source line 51 that feeds the first power-source voltage VCC and is supplied through its gate with the first power-source voltage VCC, a third constant-current source circuit 61 which is connected at its one end to the source of the sixth field-effect transistor 57 and is connected at its other end to a data line DL which is the signal read line, a fourth constant-current source circuit 62 which is connected at its one end to the data line DL that is the signal read line and is connected at its other end to a second power-source line 55 which feeds the second power-source voltage VSS lower than the first power-source voltage VCC, and a seventh field-effect transistor 58 which is connected at its drain to the first power-source line 52, supplied through its gate with the third reference voltage Vref3, and is connected at its source to the data line DL which is the signal read line.

That is, in this embodiment, the reference voltage-forming means 200 outputs only one kind of reference voltage Vref3 (third reference voltage) which has a voltage level that maintains a predetermined potential difference with respect to the first power-source voltage VCC. In effect, in this embodiment, the first power-source voltage VCC fed to the gate of the sixth FET 57 is utilized as a reference voltage.

In this embodiment, it is possible, as a matter of course, to generate from the reference voltage-forming circuit 200 a fourth reference voltage Vref4 having a predetermined potential difference with corresponds to the third reference voltage Vref3.

In this embodiment, furthermore, the data line is read out without using the write enable signal $\overline{WE}$. Therefore, the second FET 26 used in the first embodiment is omitted here.

In this embodiment, a constant-current circuit is formed with D·FETs 61 and 62, which, however, is merely an example and can be replaced by any other constant-current circuit.

Moreover, the FETs used in this embodiment have the same structures as those of the first embodiment. That is, in the data line pull-up circuit 101 of FIG. 1, reference numerals 51 to 54 denote VCC power-source lines, and reference numerals 55 and 56 denote VSS power-source lines. In the logic voltage amplitude determining means 301, reference numerals 57 to 60 denote E·FETs, 61 to 64 denote D·FETs, and 65 denote a reference voltage input terminal to which the reference voltage Vref3 will be input.

Figure 3:
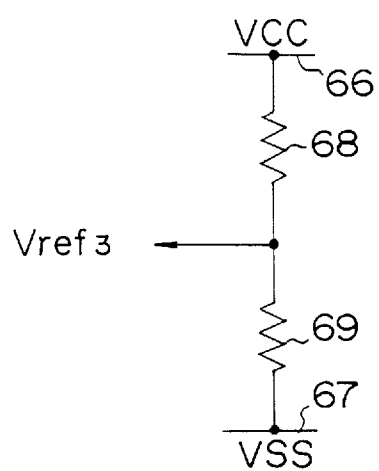
FIG. 3 is a circuit diagram illustrating a reference voltage-forming circuit.

The reference voltage Vref3 is formed by a voltage divider circuit which is shown in FIG. 3 wherein reference numeral 66 denotes a VCC power-source line, 67 denotes a VSS power-source line, and 68 and 69 denote resistors.

Here, if the resistors 68 and 69 have resistances R68 and R69, the reference voltage Vref3 is given as Vref3=(VCC−VSS)×[R69/(R68+R69)]. The voltage-dividing ratio R69/(R68+R69), however, remains constant irrespective of a change in the temperature and the reference voltage Vref3 remains constant, too, irrespective of the change in temperature.

As designated at 301 in FIG. 1 which illustrates the second embodiment, the static RAM includes a sixth enhancement-type Schottky gate field-effect transistor 57 which is connected at its drain to the first power-source line 51 that feeds the first power-source voltage VCC and is supplied with the first power-source voltage VCC through its gate, an eighth depletion-type Schottky gate field-effect transistor 61 which is connected at its drain to the source of the first Schottky gate field-effect transistor 57 and is connected at its gate and source to the data line DL, a ninth depletion-type Schottky gate field-effect transistor 62 which is connected at its drain to the data line DL and is connected at its gate and source to the second power-source line 55 that feeds the second power-source voltage VSS lower than the first power-source voltage, and a seventh enhancement-type Schottky gate field-effect transistor 58 which is connected at its drain to the first power source line 52, supplied with the third reference voltage Vref3 through its gate, and is connected at its source to the data line DL.

In this embodiment, the data line pull-up circuit 101 feeds the power-source voltage VCC to the gates of the E·FETs 57 and 59. Therefore, if the power-source voltage VCC does not change depending upon the temperature, the voltage amplitude can be maintained constant when the data lines DL, $\overline{DL}$ are being read out and a stable voltage amplitude can be maintained irrespective of variations in the process parameters or a change in the temperature as in the bit line pull-up circuit 100.

The reference voltage Vref4 greater than the reference voltage Vref3 may be fed to the gates of the E·FETs 57 and 59 instead of feeding the power-source voltage VCC thereto. In this case, the voltage amplitude of the data lines DL, $\overline{DL}$ is determined by a voltage difference between the reference voltages Vref3 and Vref4.

In the aforementioned embodiments, the reference voltages Vref1, Vref2 and Vref3 are formed by the voltage divider circuit which is made up of resistors connected in series. The reference voltages, however, may be formed by using transistors instead of using the voltage divider circuit.

According to the first embodiment of the present invention in which a voltage difference between the first reference voltage and the second reference voltage that do not change depending upon temperature is reflected on the voltage amplitude of the bit line during the reading operation, the voltage amplitude of the bit line is maintained at a small constant value and is stabilized during the reading operation irrespective of variations in the process parameters or a change in temperature. Therefore, the data can be stably read out at high speeds.

According to the second embodiment of the present invention, the voltage amplitude of the data line during the reading operation is determined by a voltage difference between the first reference voltage and the second reference voltage that do not change depending on temperature or is determined by a voltage difference between the first reference voltage that does not change depending on temperature and the power-source voltage. Therefore, the voltage amplitude of the data line is maintained constant and is stabilized during the reading operation irrespective of variation in the process parameters or a change in temperature.

I claim:

1. A static RAM equipped with a bit line pull-up circuit comprising:

a reference voltage-forming circuit consisting only of a plurality of resistors, said reference voltage-forming circuit being connected to a first power-source line that feeds a first power-source voltage and being connected to a second power-source line that feeds a second power-source voltage smaller than the first power-source voltage, said reference voltage-forming circuit forming at least either one of a first reference voltage or a second reference voltage that does not change depending upon temperature, the first reference voltage and the second reference voltage being different from each other; and a circuit which determines the logic voltage amplitude of a bit line during a reading operation based upon either a potential difference between the first reference voltage and the second reference voltage formed by said reference voltage-forming circuit or a potential difference between one of said power-source voltages and at least either one of the first or second reference voltages produced by said reference voltage-forming circuit, wherein said bit line pull-up circuit comprises a first field-effect transistor having a drain connected to the first power-source line that feeds the first power-source voltage and is supplied with the first reference voltage through its gate, a first constant-current source having a first end connected to a source of the first field-effect transistor and a second end connected to the bit line, a second constant-current source having a first end connected to the bit line and a second end connected to the second power-source line that feeds the second power-source voltage which is less than the first power-source voltage, a second field-effect transistor having a drain connected to the first power-source line and being supplied with a write enable signal through its gate, and a third field-effect transistor having a drain connected to a source of the second field-effect transistor, supplied with the second reference voltage through a gate of the third field-effect transistor, and having a source connected to the bit line.

2. A static RAM according to claim 1, wherein said constant-current sources consist of depletion-type field-effect transistors.

3. A static RAM according to claim 1, wherein at least one of said first to third field-effect transistors is an enhancement-type field-effect transistor.

4. A static RAM equipped with a bit line pull-up circuit comprising:

a reference voltage-forming circuit consisting only of a plurality of resistors, said reference voltage-forming circuit being connected to a first power-source line that feeds a first power-source voltage and being connected to a second power-source line that feeds a second power-source voltage smaller than the first power-source voltage, and said reference voltage-forming circuit forming at least either one of a first reference voltage or a second reference voltage that does not change depending upon temperature, the first reference voltage and the second reference voltage being different from each other; and a circuit for determining the logic voltage amplitude of a bit line during a reading operation based upon either a potential difference between the first reference voltage and the second reference voltage formed by said reference voltage-forming circuit or a potential difference between one of said power-source voltages and at least either one of the first or second reference voltages produced by said reference voltage-forming circuit, wherein said bit line pull-up circuit comprises a first enhancement-type Schottky gate field-effect transistor having a drain connected to the first power-source line that feeds the first power-source voltage and is supplied with the first reference voltage through its gate, a second depletion-type Schottky gate field-effect transistor having a drain connected to a source of the first Schottky gate field-effect transistor and its gate and source connected to the bit line, a third depletion-type Schottky gate field-effect transistor having a drain connected to the bit line and its gate and a source connected to the second power-source line that feeds the second power-source voltage less than the first power-source voltage, a fourth enhancement-type Schottky gate field-effect transistor having a drain connected to the first power-source line and being supplied with a write enable signal through its gate, and a fifth enhancement-type Schottky gate field-effect transistor having a drain connected to a source of the fourth Schottky gate field-effect transistor, supplied through a gate of the fifth enhancement-type Schottky gate field-effect transistor with the second reference voltage, and being connected to the bit line at a source of the fifth enhancement-type Schottky gate field-effect transistor.

* * * * *